US008847269B2

(12) United States Patent
Yamamuro et al.

(10) Patent No.: US 8,847,269 B2
(45) Date of Patent: Sep. 30, 2014

(54) ORGANIC LIGHT-EMITTING DEVICE

(75) Inventors: Yutaka Yamamuro, Kyoto (JP); Suguru Okuyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 56 days.

(21) Appl. No.: 13/305,725

(22) Filed: Nov. 28, 2011

(65) Prior Publication Data

US 2012/0132950 A1 May 31, 2012

(30) Foreign Application Priority Data

Nov. 29, 2010 (JP) .................................. 2010-264826

(51) Int. Cl.
*H01L 33/00* (2010.01)
*H01L 51/00* (2006.01)
*H01L 21/00* (2006.01)
*H01L 51/52* (2006.01)

(52) U.S. Cl.
CPC .................................. *H01L 51/529* (2013.01)
USPC .......... 257/99; 257/40; 257/E51.018; 438/28; 313/46

(58) Field of Classification Search
CPC . H01L 51/5237; H01L 51/529; H01L 51/057; H01L 51/0541; H01L 51/0545; H01L 51/50; H01L 51/52; H01L 51/524; H01L 51/5246; H01L 51/5268; H01L 51/59; H01L 21/3221; H01L 21/3225; H01L 27/3248; H01L 27/3262; H01L 27/3274; H01L 27/3265
USPC .......... 313/46, 513, 553, 504, 506, 488, 489, 313/502, 507, 559, 561; 257/98, 99, 40, 257/E51.001, E51.018, E51.019, E51.022; 438/28, 23, 12, 29, 35, 956
See application file for complete search history.

(56) References Cited

U.S. PATENT DOCUMENTS

| | | | |
|---|---|---|---|
| 8,692,263 B2* | 4/2014 | Nam et al. | 257/88 |
| 2005/0122036 A1* | 6/2005 | Park et al. | 313/504 |
| 2006/0275952 A1* | 12/2006 | Gowda et al. | 438/122 |
| 2008/0018245 A1* | 1/2008 | Kim et al. | 313/512 |
| 2010/0214777 A1* | 8/2010 | Suehiro et al. | 362/235 |
| 2011/0096504 A1* | 4/2011 | Hild | 361/704 |
| 2013/0020955 A1* | 1/2013 | Igaki et al. | 315/201 |
| 2013/0200300 A1* | 8/2013 | Do et al. | 252/75 |

FOREIGN PATENT DOCUMENTS

JP 2009-134897 A 6/2009

OTHER PUBLICATIONS thermal-conductivity-d_429.pdf.*
silicone_liquid_inert.pdf.*

* cited by examiner

*Primary Examiner* — Julio J Maldonado
*Assistant Examiner* — Moazzam Hossain
(74) *Attorney, Agent, or Firm* — Rabin & Berdo, P.C.

(57) ABSTRACT

An organic light-emitting device includes a base plate, an organic light-emitting body formed on the base plate, a heat-transferring filling material formed around the organic light-emitting body to cover the organic light-emitting body, the heat-transferring filling material having an electrically insulating property, and a sealing plate arranged on the heat-transferring filling material.

19 Claims, 11 Drawing Sheets

UV Irradiated

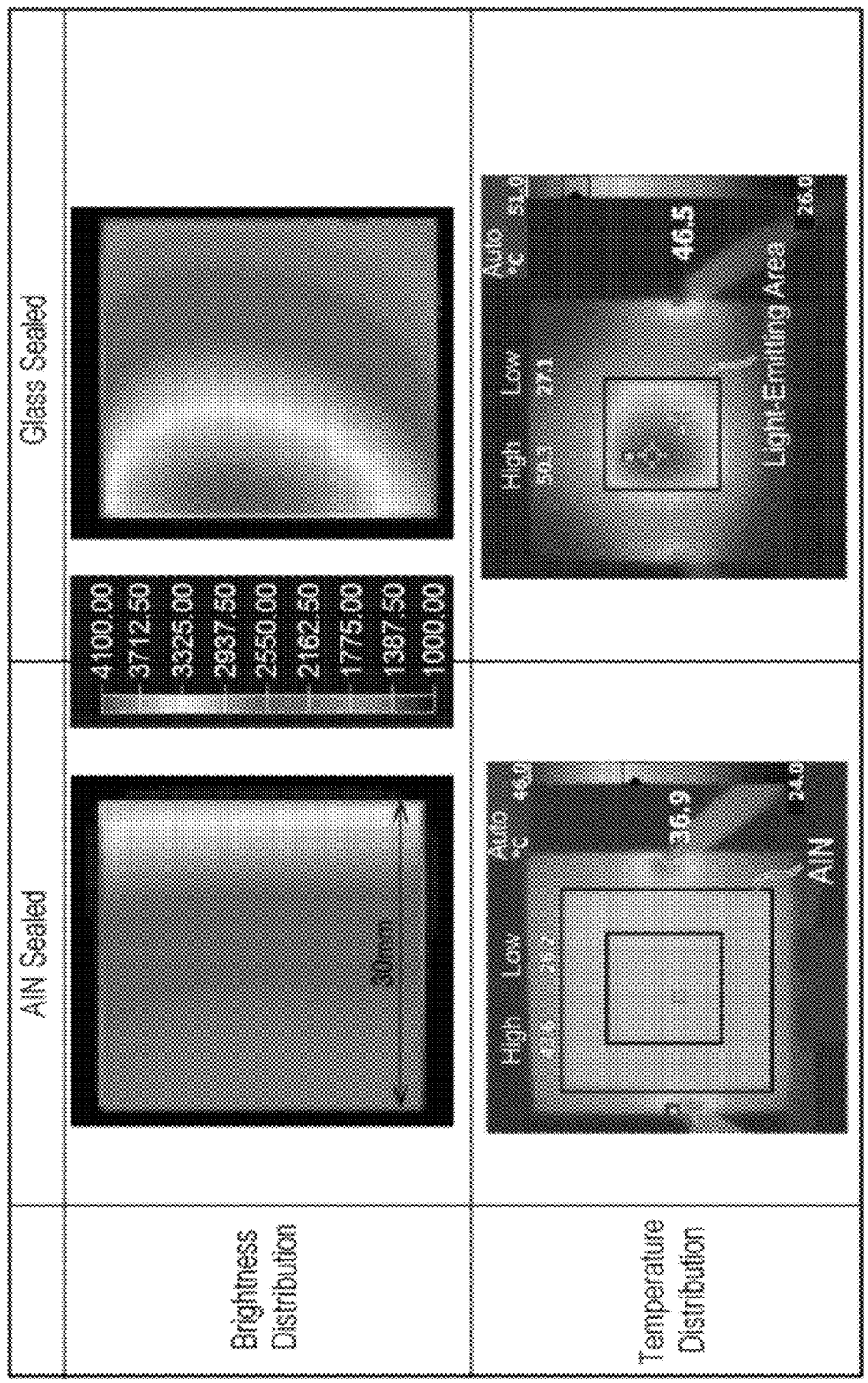

US 8,847,269 B2

ORGANIC LIGHT-EMITTING DEVICE

CROSS-REFERENCE TO RELATED APPLICATION

This application is based upon and claims the benefit of priority from Japanese Patent Application No. 2010-264826, filed on Nov. 29, 2010, the entire contents of which are incorporated herein by reference.

TECHNICAL FIELD

The present disclosure relates to an organic light-emitting device provided with an organic light-emitting body.

BACKGROUND

In a conventional organic light-emitting device, sealing is performed in a manner as shown in FIG. 12 of JP2009-134897A. An inert gas or the like is filled in an internal space, called a getter chamber, which is formed between a sealing plate and a glass substrate. A drying material is also arranged in the internal space. This helps prevent an organic light-emitting layer from making contact with external moisture or water.

However, the heat transfer to the sealing plate by the convection of the inert gas is very small, and the heat conductivity of an organic light-emitting layer and the glass substrate is low. This leads to an increase in device temperature because the low heat transfer and conductivity will lead to the retention of heat generated during the operation of the light-emitting device. In an organic light-emitting device such as an organic EL (electroluminescence) device or the like, the temperature of the light-emitting device is increased by so-called Joule heat, the heat generated by electric resistors within the light-emitting device. It is known that such temperature rise accelerates degradation of an organic thin film and separation of an electrode film, becoming a major cause of the reduction of the lifespan and performance of a light-emitting device. The light-emitting device results in a destructive cycle in that temperature rise leads to easy flow of a current which in turn results in temperature rise. The temperature rise is directly associated with the lifespan.

In view of this, as shown in FIG. 1 of JP2009-134897A, there is proposed a structure in which, for the purpose of enhancing heat dissipation, a heat transferring member is arranged between a sealing plate and a cathode layer to thereby dissipate heat.

In the prior art referred to above, however, the heat transferring member makes close contact with only the upper surface of the cathode layer with no provision of a space for the getter chamber. For that reason, heat dissipation is insufficient. Moreover, the drying material needs to be arranged in the getter chamber, which makes the manufacturing process complex and costly.

SUMMARY

The present disclosure provides some embodiments of an organic light-emitting device that has a simplified structure while enhancing heat dissipation.

According to one embodiment of the present disclosure, an organic light-emitting device includes: a base plate; an organic light-emitting body formed on the base plate; a heat-transferring filling material formed around the organic light-emitting body to cover the organic light-emitting body, the heat-transferring filling material having an electrically insulating property; and a sealing plate arranged on the heat-transferring filling material.

BRIEF DESCRIPTION OF THE DRAWINGS

FIG. 9 is a view explaining how variations in a temperature distribution and a brightness distribution are reduced when ceramic is used as a sealing plate.

DETAILED DESCRIPTION

Figure 1:
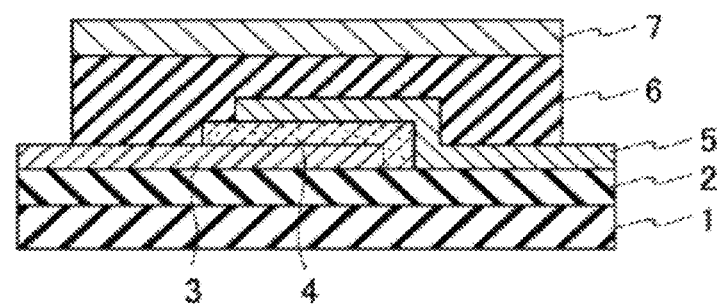
FIG. 1 is a section view showing one configuration example of an organic light-emitting device according to the present disclosure.

One embodiment of the present disclosure will now be described in detail with reference to the drawings. In the drawings, identical or similar components will be designated by identical or similar reference symbols. The drawings relating to structures are depicted schematically. Portions differing in dimensions and scales are sometimes included in the respective drawings.

An organic light-emitting device can be configured as shown in FIG. 1 which is a section view showing one configuration example of an organic light-emitting device according to the present disclosure. The organic light-emitting device includes a first flexible base plate 1, a second flexible base plate 2, a first electrode 3, an organic light-emitting body 4, a second electrode 5, an adhesive heat-transferring filling material 6 and a sealing plate 7.

The second flexible base plate 2, the first electrode 3, the organic light-emitting body 4 and the second electrode 5 are laminated one above another on the first flexible base plate 1. The adhesive heat-transferring filling material 6 is formed around the organic light-emitting body 4 to cover a portion of the first electrode 3 making contact with the organic light-emitting body 4, a portion of the second electrode 5 making contact with the organic light-emitting body 4 and the entirety of the organic light-emitting body 4. In other words, the adhesive heat-transferring filling material 6 makes close contact with the organic light-emitting body 4, the first electrode 3 and the second electrode 5. The organic light-emitting body 4 is embedded between the second flexible base plate 2 and the adhesive heat-transferring filling material 6. The configuration example of the organic light-emitting device shown in FIG. 1 is a so-called bottom emission type in which the light emitted from the organic light-emitting body 4 comes out at the side of the first flexible base plate 1.

The first flexible base plate 1 is an electrically insulating body with flexibility and is made of, for example, plastic transparent to light. The second flexible base plate 2 is an electrically insulating body transparent to light and is made of glass or the like because there is a need to form the organic light-emitting body 4 thereon. In order to comply with the flexibility requirement, an extremely thin glass sheet having a thickness of about 50 μm is used in making the second flexible base plate 2. The first flexible base plate 1 also plays the role of protecting the second flexible base plate 2 against cracking when a force is applied to the organic light-emitting device.

The first electrode 3 is formed of a transparent ITO (Indium-Tin Oxide) electrode having a thickness of about 150 to 450 nm and capable of transmitting light therethrough. In the present embodiment, the first electrode 3 corresponds to a cathode.

The adhesive heat-transferring filling material 6 serves to transfer the Joule heat generated in the organic light-emitting body 4 to the sealing plate 7, thereby dissipating the heat. The adhesive heat-transferring filling material 6 also plays the role of bonding the sealing plate 7 to the side of the base plates. The adhesive heat-transferring filling material 6 needs to be provided with electric insulation and flexibility. Accordingly, it is preferable to use a resin such as a UV-curable resin or a thermosetting resin as the adhesive heat-transferring filling material 6.

The sealing plate 7 protects and seals the first electrode 3, the second electrode 5 and the organic light-emitting body 4. As the sealing plate 7, it is possible to use metal, ceramic, flexible plastic, etc.

The organic light-emitting body 4 is formed to have an organic EL (electroluminescence) structure. The organic light-emitting body 4 is made by laminating a hole transport layer, a light-emitting layer and an electron transport layer one above another on the first electrode 3. In addition, a hole injection layer or an electron injection layer may be included in the organic light-emitting body 4.

In the present embodiment, the second electrode 5 corresponds to an anode and is made of aluminum to have a thickness of, e.g., about 60 to 150 nm. In the organic light-emitting device shown in FIG. 1, the distance from the first flexible base plate 1 to the sealing plate 7 may be about 0.3 mm.

In this manner, the conventionally used hollow portion, called a getter chamber, is not used, by completely covering the organic light-emitting body with the heat-transferring filling material such as a resin or the like. The aforementioned material, having increased heat conductivity and heat dissipation, is used as the sealing plate. Therefore, the heat generated in the organic light-emitting body is diffused to the heat-transferring filling material and then transferred to the sealing plate. Thus, the heat is efficiently dissipated from the sealing plate to the outside. This makes it possible to realize effective heat uniformalizing and dissipating of the organic light-emitting device. Moreover, the organic light-emitting device as a whole can be made flexible by using a flexible material as the base plates, the heat-transferring filling material and the sealing plate.

Figure 2:
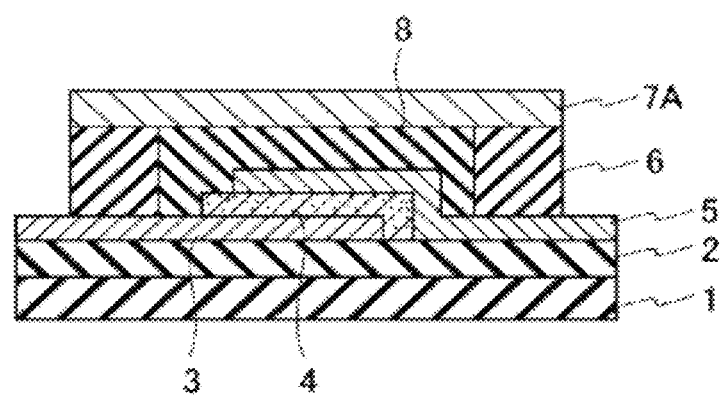
FIG. 2 is a section view showing another configuration example of the organic light-emitting device according to the present disclosure.

FIG. 2 shows a structure similar to that shown in FIG. 1 but mainly differing in the structure of the filling material. The same portions as those shown in FIG. 1 are designated by like reference numerals and will not be described in detail. The filling material is divided into an adhesive heat-transferring filling material 6 and a heat-transferring filling material 8. The adhesive heat-transferring filling material 6 remains the same as that shown in FIG. 1 and serves as a bonding layer. Thus, the adhesive heat-transferring filling material 6 is made of a resin such as a UV-curable resin or a thermosetting resin. On the other hand, the heat-transferring filling material 8 is made of a material different than the adhesive heat-transferring filling material 6. The heat-transferring filling material 8 may be a solid or liquid filling material.

Unlike the adhesive heat-transferring filling material 6, the heat-transferring filling material 8 does not need to serve as a bonding layer. The heat-transferring filling material 8, if liquid, may be an inert material, e.g., fluorine oil superior in heat resistance, incombustibility and chemical resistance. Alternatively, the heat-transferring filling material 8, if solid or liquid, may be a filling material having a getter function. The getter function referred to herein means a function of adsorbing oxygen or moisture. In order for the organic light-emitting device to have flexibility, it is preferred that the heat-transferring filling material 8 be a solid material having a getter function and flexibility. If the heat-transferring filling material 8 is solid or liquid, a physical adsorbent such as zeolite or the like, a material containing a chemically adsorbing component or a material having functions of physical and chemical adsorption may be used as the heat-transferring filling material 8. The adhesive heat-transferring filling material 6 and the heat-transferring filling material 8 may be formed to have a thickness of, e.g., about 20 μm.

The sealing plate 7A shown in FIG. 2 is made of a material superior not only in flexibility but also in heat conductivity and heat dissipation. As a material superior in heat conductivity and heat dissipation, it is preferable to use a sealing material having a thermal conductivity rate greater than that of glass, namely greater than 1 W/m·K. One example of a sealing material complying with these conditions includes a metal film. The metal film may be made of metal, e.g., copper (Cu) or aluminum (Al), to have a thickness of about 100 μm or less.

Figure 3:
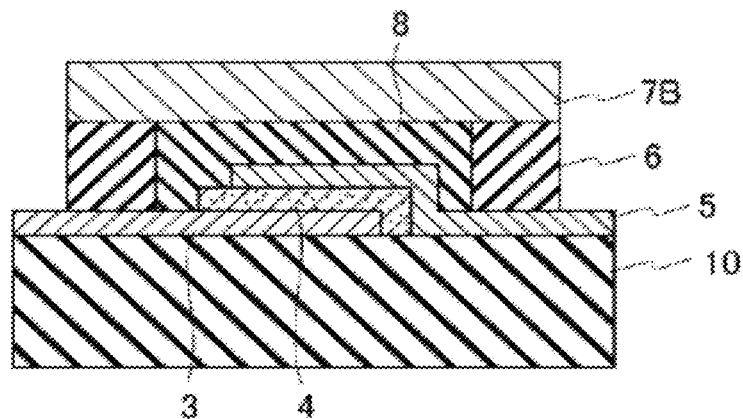
FIG. 3 is a section view showing a further configuration example of the organic light-emitting device according to the present disclosure.

FIG. 3 shows one example of the organic light-emitting device that does not require flexibility. Since the organic light-emitting device shown in FIG. 3 does not require flexibility, it differs in the sealing plate and the base plate from the organic light-emitting device shown in FIG. 2. The same portions as those shown in FIG. 2 are designated by like reference numerals and will not be described in detail. The base plate 10 does not require flexibility and, therefore, is made of a material such as glass or the like, which is an electrically insulating body transparent to light. In this case, the total thickness of the base plate 10, the first electrode 3, the organic light-emitting body 4 and the second electrode 5 is, e.g., about 0.7 mm.

The sealing plate 7B shown in FIG. 3 does not require flexibility and may be made of a material superior in heat conductivity and heat dissipation. More specifically, the sealing plate 7B may be made of metal such as copper (Cu), aluminum (Al), nickel (Ni) or copper-molybdenum (Cu—Mo) alloy, or ceramic such as AlN or $Al_2O_3$.

Figure 4A:
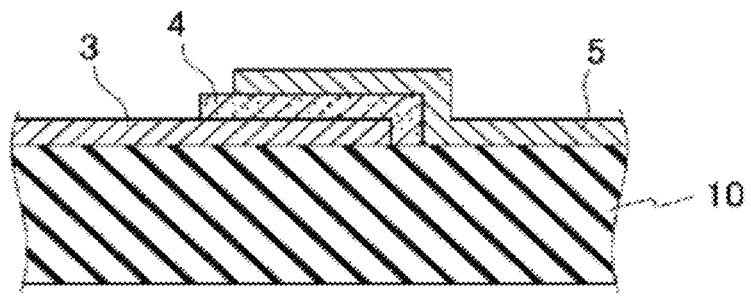
FIGS. 4A through 4C are views illustrating a manufacturing process of the organic light-emitting device according to the present disclosure.
Figure 4B:
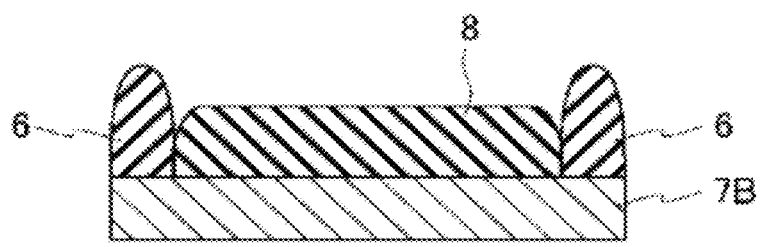
Figure 4C:
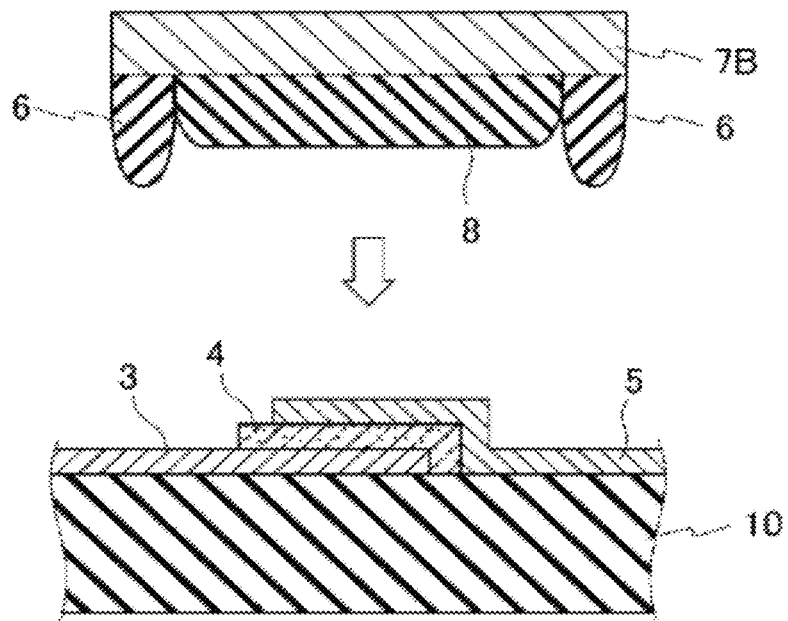
Figure 5:
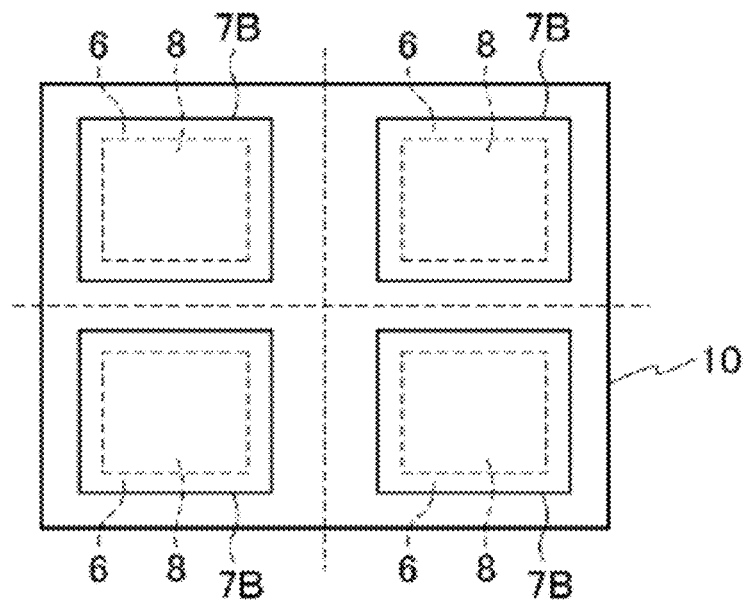
FIG. 5 is a plan view of an overall array structure of a base plate for manufacturing the organic light-emitting device according to the present disclosure.

Next, a method of manufacturing the organic light-emitting device will be briefly described with reference to FIGS. 4A, 4B and 4C by taking the structure shown in FIG. 3 as an example. As shown in FIG. 4A, the first electrode 3 is patterned on the base plate 10 and is etched. Then, the organic light-emitting body 4 is formed by a vacuum deposition method. Thereafter, the second electrode 5 is formed as a film. As shown in FIG. 4B, the adhesive heat-transferring filling material 6 with adhesiveness and the heat-transferring filling material 8 differing from the adhesive heat-transferring filling material 6 are applied on the sealing plate 7B. Next, as shown in FIG. 4C, the sealing plate 7B is pressed against and bonded to the base plate 10, thereby producing an array of organic light-emitting devices, as shown in FIG. 5. In order to completely remove cavities, it is preferred that the pressing step be performed under a vacuum condition.

FIG. 5 is a plan view of an overall array structure of the base plate for manufacturing the organic light-emitting device. Four organic light-emitting devices are formed on the base plate 10 having a rectangular shape. Each of the organic light-emitting devices includes the first electrode 3, the organic light-emitting body 4, the second electrode 5, the adhesive heat-transferring filling material 6, the heat-transferring filling material 8 and the sealing plate 7B, all of which are formed one above another on the base plate 10. The sealing plate 7B has a square shape when seen from a plan view. If the array structure shown in FIG. 5 is scribe-cut along the broken lines extending in the vertical and horizontal directions, the organic light-emitting device shown in FIG. 3 is completed.

Figure 6:
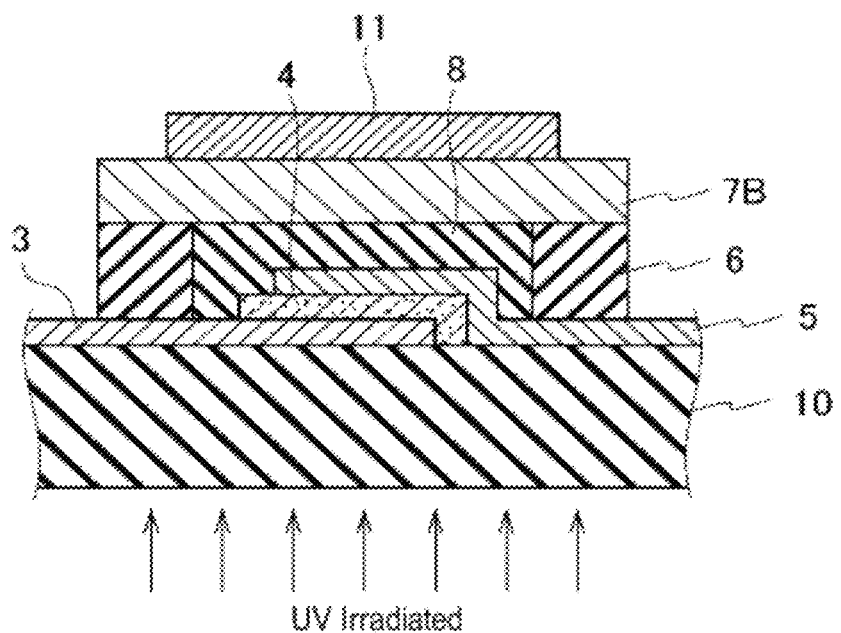
FIG. 6 is a view illustrating the step of curing a bonding layer in the manufacturing process of the organic light-emitting device.

In this regard, the adhesive heat-transferring filling material 6 with adhesiveness is made of a resin such as a UV-curable resin or a thermosetting resin. In the case of using, e.g., a UV-curable resin, after the bonding step shown in FIG. 4C, UV (ultraviolet) light is irradiated as illustrated in FIG. 6 to thereby cure and bond the UV-curable resin of the adhesive heat-transferring filling material 6. In the case of filling the adhesive heat-transferring filling material 6 and then curing the same by irradiation of UV light as illustrated in FIG. 6, however, heat is generated during the UV light irradiation. Therefore, there is a possibility that warping occurs in the organic light-emitting device due to the difference in the thermal expansion coefficients of the base plate 10 and the sealing plate 7B, consequently causing damage to the electrodes.

In view of this, if the sealing plate 7B differing in thermal expansion coefficient from the base plate 10 is used and the UV-curable resin of the adhesive heat-transferring filling material 6 is cured by UV light irradiation as illustrated in FIG. 6 to bond the sealing plate 7B and the base plate 10 together through the adhesive heat-transferring filling material 6, a cooling member 11 may be arranged on a portion of the organic light-emitting device, e.g., on the sealing plate 7B. The cooling member 11 may be formed of, e.g., a Peltier element. The base plate 10 and the sealing plate 7B are cooled by the cooling effect of the cooling member 11 and are kept substantially at room temperature. This makes it possible to prevent warping from occurring in the organic light-emitting device by the heat during the UV light irradiation.

If the organic light-emitting device thus obtained is driven, Joule heat is generated from the organic light-emitting body 4 and warping occurs in the organic light-emitting device due to the difference in the thermal expansion coefficients of the base plate 10 and the sealing plate 7B. In order to avoid such situation, the cooling member 11 may be left as arranged in the organic light-emitting device. The arrangement of the cooling member 11 can also be applied to the configurations shown in FIGS. 1 and 2.

Figure 12:
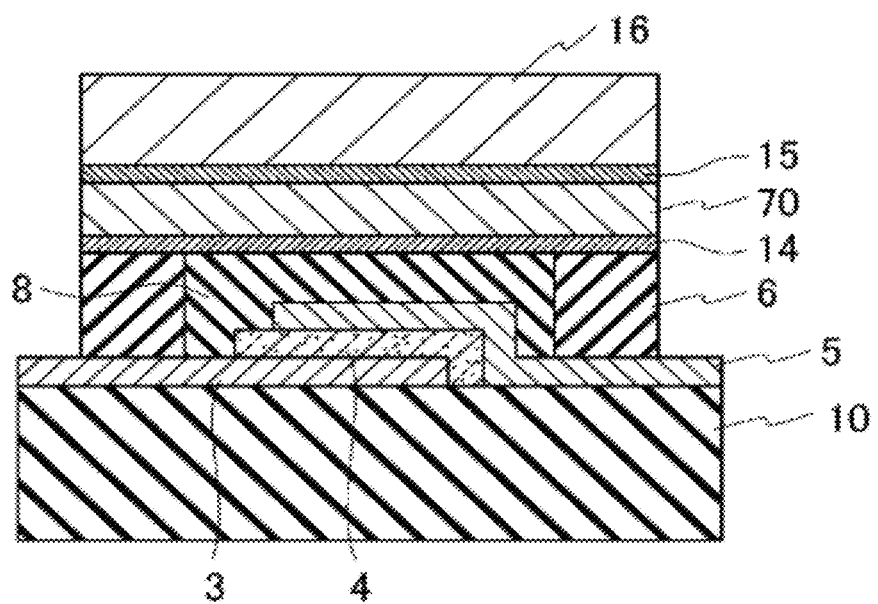
FIG. 12 is a section view showing one configuration example of the organic light-emitting device with the addition of a structure for the prevention of a warp when a base plate and a sealing plate are made of different kinds of materials.

The organic light-emitting device thus manufactured was compared with a conventional organic light-emitting device. A device having a structure as shown in FIG. 12 of JP2009-134897A was used as the conventional organic EL device. The relationship between the brightness halving lifespan and the temperature was measured.

Figure 7:
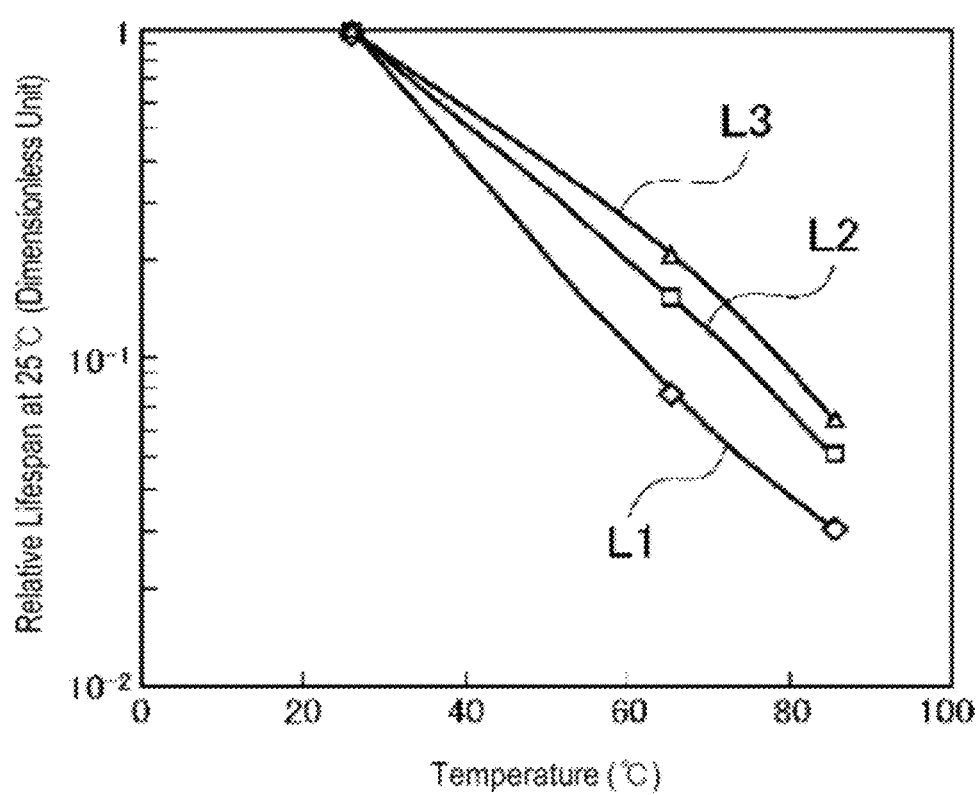
FIG. 7 is a view representing the temperature dependency of a brightness halving lifespan of an organic EL device.

The measurement results are represented in FIG. 7. The brightness halving lifespan of the organic EL device was measured at 25 degrees C. (room temperature). The organic EL device was put into constant-temperature ovens of 65 degrees C. and 85 degrees C. to measure the brightness halving lifespan thereof. The term "brightness halving lifespan" used herein refers to the period (time period) in which the initial brightness of the organic EL device is reduced to one half when the organic EL device is supplied with an electric current and is caused to continuously emit light. In FIG. 7, the horizontal axis indicates the temperature of the atmosphere in which the organic EL device is arranged, and the vertical axis denotes the relative lifespan when the brightness halving lifespan at 25 degrees C. is assumed to be 1.

L1 is a measurement curve when the initial brightness is set equal to 1000 $cd/m^2$ by adjusting the current flowing through the organic EL device, L2 is a measurement curve when the initial brightness is set equal to 3000 $cd/m^2$, and L3 is a measurement curve when the initial brightness is set equal to 5000 $cd/m^2$. As the temperature is increased from 25 degrees C. to 65 degrees C. and 85 degrees C., the brightness halving lifespan is reduced to 1/10 regardless of the initial brightness, revealing that the degradation of the organic EL device becomes conspicuous as the temperature goes up. In contrast, if the temperature rise is suppressed, it is possible to prolong the brightness halving lifespan.

If the organic light-emitting devices shown in FIGS. 1, 2 and 3 are manufactured by using materials superior in thermal conductivity rate and heat dissipation rate, e.g., an Al film (having a thermal conductivity rate of 237 W/m·K and a heat dissipation rate of about 0.1) and a Cu film (having a thermal conductivity rate of 401 W/m·K and a heat dissipation rate of about 0.2 or less), as the sealing plate 7 or 7A, using AlN ceramic (having a thermal conductivity rate of 170 W/m·K or more and a heat dissipation rate of 0.93) and $Al_2O_3$ ceramic (having a thermal conductivity rate of 39 W/m·K and a heat dissipation rate of about 0.97) as the sealing plate 7B, and directly bonding the sealing plates only through a filling material, it is possible to dissipate the heat generated in the organic light-emitting device, thereby suppressing the temperature rise and prolonging the lifespan.

Figure 8A:
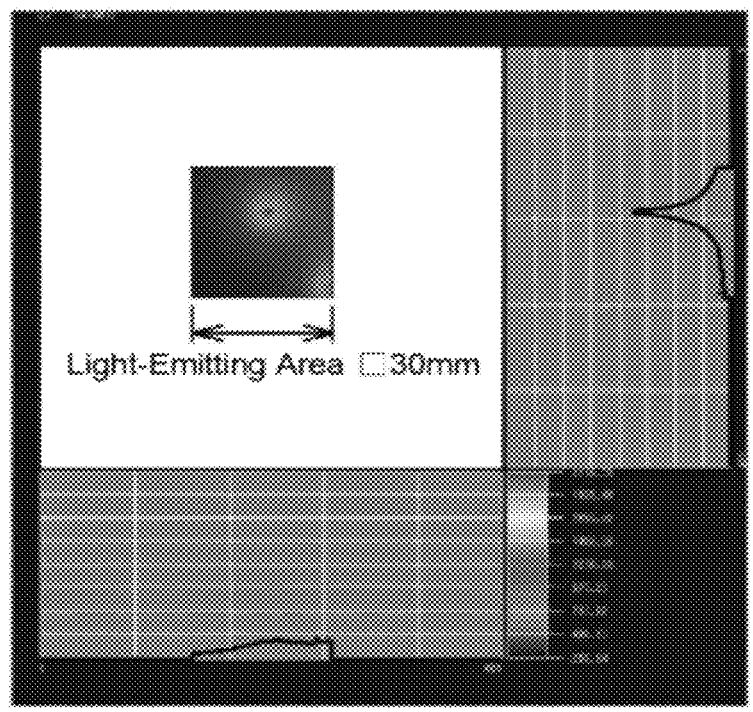
FIGS. 8A and 8B are view illustrating one example of temperature rise at a short-circuited point of the organic EL device.
Figure 8B:
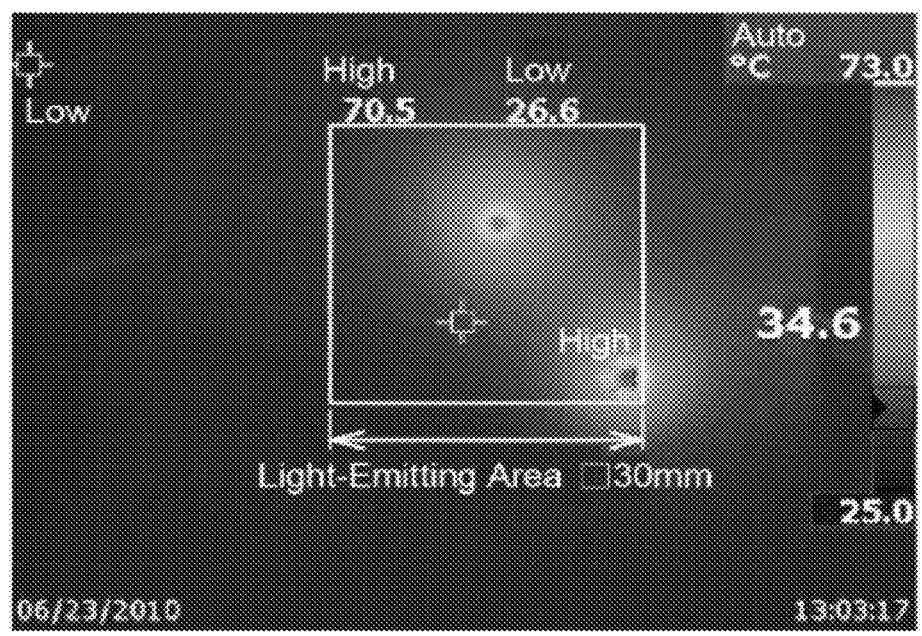

During illumination using the conventional organic EL device, it is sometimes the case that a partial short-circuit as a singular point is generated due to the existence of a foreign material. FIG. 8A is a top view of a 30 mm×30 mm light-emitting area of the organic EL device. The graphs appearing at the right side and the lower side represent the brightness distributions. FIG. 8B shows the temperature distribution in the 30 mm×30 mm light-emitting area of the organic EL device shown in FIG. 8A. The central region in FIG. 8B looks whitish because the temperature in a specific region of the light-emitting area is high. The point having a particularly high brightness distribution, i.e., the point having a particularly high temperature, is a region where a current is concentrated and short-circuit occurs.

As can be seen from the numerical values indicated in FIG. 8B, the highest temperature is 70.5 degrees C. and the lowest temperature is 26.6 degrees C. If the temperature grows higher, the device may possibly be destroyed. In this manner, the temperature is increased in the short-circuited point, which may sometimes trigger destruction of the device.

In general, the organic light-emitting device has a property with which a current flows more easily as the temperature goes up. Accordingly, the brightness grows higher in the area where the temperature is high. If the sealing plate is made of a material superior in heat conductivity and heat dissipation as in the present disclosure, it is possible to make the heat distribution uniform and to suppress destruction of the device. The in-plane temperature distribution is made uniform by the heat diffusion and dissipation effect, which makes it possible to reduce variations in the brightness distribution. This effect is illustrated in FIGS. 9 and 10.

FIG. 9 compares the brightness distribution and the temperature distribution of the organic light-emitting device of the present disclosure shown in FIG. 3, in which the sealing plate is made of AlN ceramic, and the conventional light-emitting device (the structure shown in FIG. 12 of JP2009-134897A) in which the sealing plate is made of glass. It can be noted that the deviation in the brightness distribution is greater in the conventional organic light-emitting device having the glass-made sealing plate than in the organic light-emitting device of the present disclosure. It can also be appreciated that, unlike the conventional organic light-emitting device, the temperature in the central area of the organic light-emitting device of the present disclosure having the sealing plate made of AlN ceramic is reduced from 46.5 degrees C. to 36.9 degrees C.

Figure 10A:
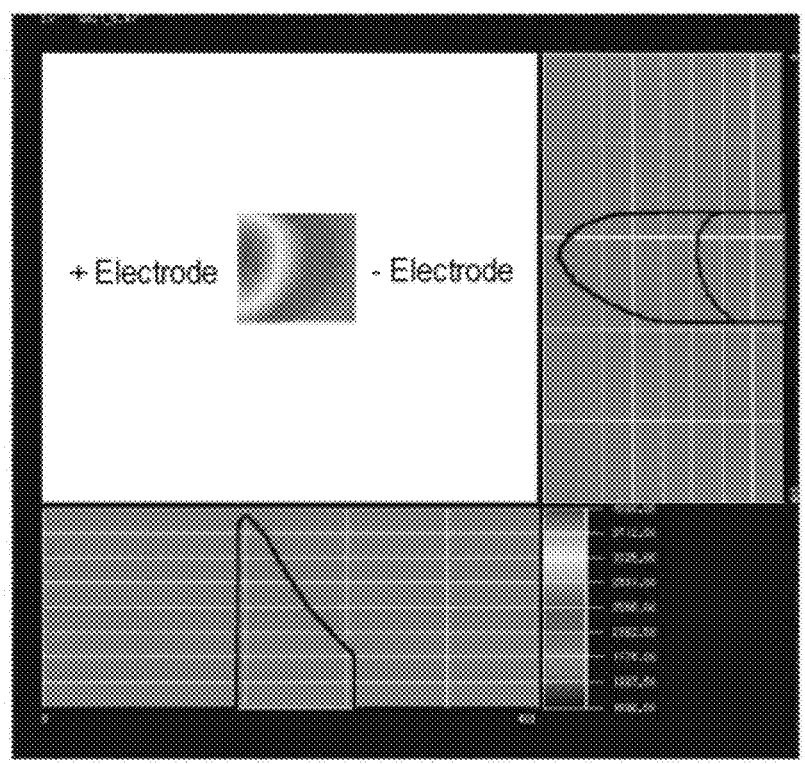
FIGS. 10A and 10B are views depicting brightness distribution curves in the brightness distribution shown in FIG. 9.
Figure 10B:
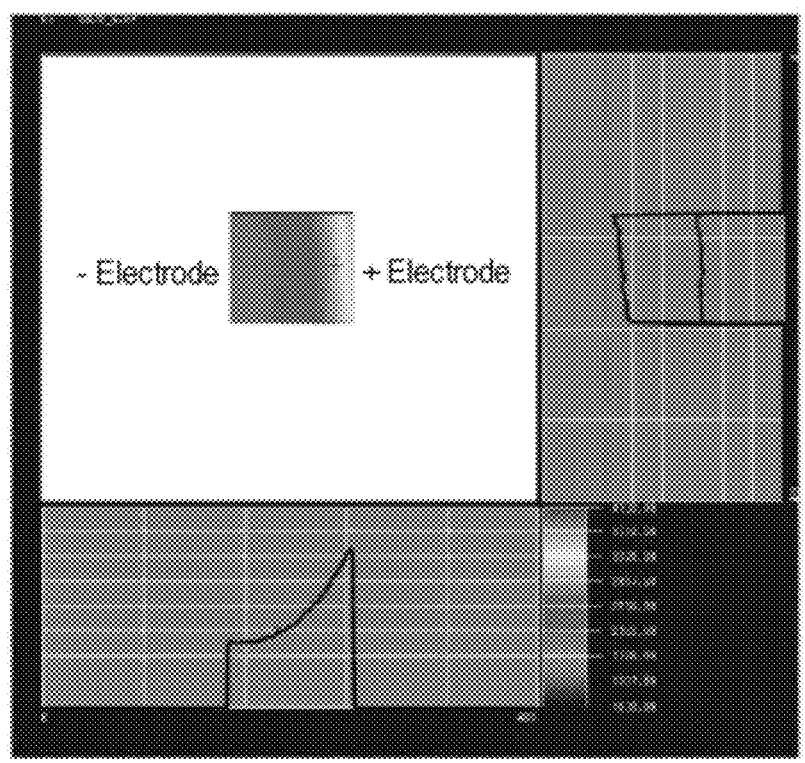

FIGS. 10A and 10B are views graphically representing the vertical brightness distribution and the horizontal brightness distribution which are extracted from the brightness distribution shown in FIG. 9. FIG. 10A corresponds to the organic light-emitting device of the present disclosure having the sealing plate made of AlN ceramic. FIG. 10B corresponds to the conventional organic light-emitting device having the sealing plate made of glass. The temperature distribution is more uniform in FIG. 10A than in FIG. 10B, which helps improve the variation in the brightness distribution.

Assuming that the average value of the brightness of the respective pixels of an image is I1 and the standard deviation of the brightness is I2, the variation coefficient is represented by I2/I1. The variation coefficient, when calculated, is 17.8% in the organic light-emitting device of the present disclosure and 24.7% in the conventional organic light-emitting device. It is thought that the variations can be reduced in the organic light-emitting device of the present disclosure having the sealing plate made of AlN ceramic. Referring to the graph of the horizontal axis shown in FIG. 10A, the brightness is reduced as the distance from the positive electrode to the negative electrode grows larger. This is due to the increased resistance value of an ITO sheet used as an anode. The resistance value becomes greater as the distance from a voltage connection terminal grows larger. As a result, a voltage drop occurs, which makes the organic light-emitting device darker.

Figure 11:
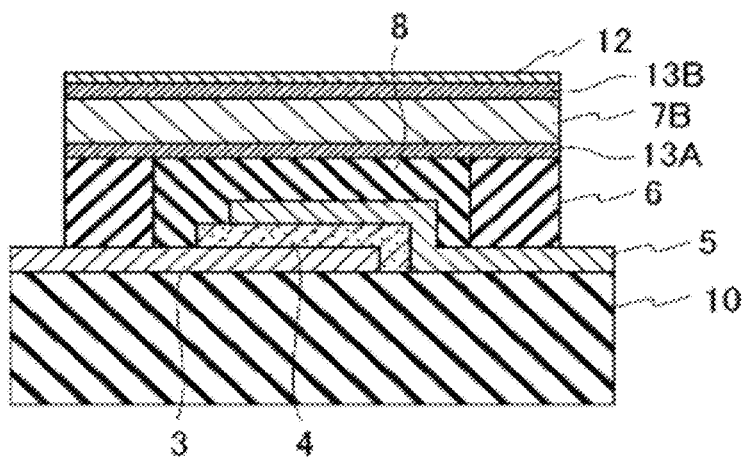
FIG. 11 is a section view showing one configuration example of the organic light-emitting device with the addition of a structure for the enhancement of heat dissipation.

FIG. 11 shows a configuration of the organic light-emitting device in which the heat dissipation of the sealing plate is enhanced. The organic light-emitting device shown in FIG. 11 is configured by adding a means for enhancing the heat dissipation to the organic light-emitting device shown in FIG. 3. The same portions as those shown in FIG. 3 are designated by like reference numerals and will not be described in detail.

First, both surfaces of the metallic sealing plate 7B are subjected to a chromate coating process in advance to thereby form chromate films 13A and 13B. A heat-dissipating paint 12 is applied on the chromate film 13B. The laminated body thus formed is bonded to the adhesive heat-transferring filling material 6 and the heat-transferring filling material 8 of the structure shown in FIG. 3, thereby forming the organic light-emitting device shown in FIG. 11. The reason for forming the chromate films 13A and 13B through the chromate coating process is to increase adhesion between the heat-dissipating paint 12, the sealing plate 7B and the heat-transferring filling materials 6 and 8.

Since the thermal emissivity of metal is low (about 0.1 in case of Al), by applying the heat-dissipating paint 12, it is possible to increase the thermal emissivity and to enhance the heat dissipation. Examples of the heat-dissipating paint 12 include a paint containing a carbon material with high emissivity.

If the base plate and the sealing plate are made of different kinds of materials when manufacturing the organic light-emitting device, there is a possibility that, due to the difference in linear expansion coefficients of the base plate and the sealing plate, warping occurs by the heat generated in the bonding process shown in FIG. 6 or during the operation of the organic light-emitting device. It is therefore preferable that the linear expansion coefficient of the sealing plate 7B shown in FIG. 3 be similar to that of the base plate 10.

It is typical that a glass substrate is used as the base plate of an organic EL device. For example, if the base plate 10 is made of soda glass, it is preferable that the sealing plate be made of a material having a linear expansion coefficient which falls within ±50% of the linear expansion coefficient of the soda glass (9 to $10 \times 10^{-6}$/degrees C.). It is more preferable that the linear expansion coefficient of the sealing plate be substantially the same as the linear expansion coefficient of the soda glass. As a sealing material complying with these conditions, it is desirable to use a ceramic material. Examples of the ceramic material include AlN (having a linear expansion coefficient of $4.5 \times 10^{-6}$/degrees C.), $Al_2O_3$ (having a linear expansion coefficient of $5.3 \times 10^{-6}$/degrees C.) and zirconium ceramic (having a linear expansion coefficient of $9.4 \times 10^{-6}$/degrees C.).

However, the sealing plate 7B may not necessarily be made of a material similar in linear expansion coefficient to the base plate 10.

Referring to FIG. 12, there is shown an organic light-emitting device added with a warp-preventing structure. The organic light-emitting device shown in FIG. 12, which makes use of a metallic sealing plate 70, is configured by adding a warp-preventing structure to the organic light-emitting device shown in FIG. 3. The same portions as those shown in FIG. 3 are designated by like reference numerals and will not be described in detail. The base plate 10 is often made of glass. If the sealing plate 70 is made of metal in the organic light-emitting device shown in FIG. 12, there is a significant difference in linear expansion coefficients between the base plate 10 and the sealing plate 70. Therefore, warping may occur due to the difference in expansion length between the base plate 10 and the sealing plate 70. A warp-preventing member 16 is arranged in order to prevent occurrence of the situation stated above.

First, the metallic sealing plate 70 is subjected to surface treatment in advance and an insulating layer 14 is formed. The insulating layer 14 is an insulating body made of ceramic such as $Al_2O_3$ and has a thickness of several micrometers. The insulating layer 14 is formed to provide insulation between the metallic sealing plate 70 and the electrodes. The metallic sealing plate 70 having the insulating layer 14 formed thereon is attached to the adhesive heat-transferring filling material 6 and the heat-transferring filling material 8 of the structure shown in FIG. 3. The attachment of the metallic sealing plate 70 is performed so that the insulating layer 14 can be bonded to the adhesive heat-transferring filling material 6 and the heat-transferring filling material 8. The warp-preventing member 16 is bonded to the metallic sealing plate 70 through a bonding layer 15. The warp-preventing member 16 is made of ceramic material such as AlN ceramic or the like.

The bonding layer 15 is preferably made of an adhesive agent with high heat conductivity, e.g., an adhesive agent having a thermal conductivity rate of 5 W/m·K. If the base plate 10 is made of glass, the warp-preventing member 16 made of a material having a linear expansion coefficient similar to that of glass, e.g., AlN ceramic, is attached to the opposite side of the organic light-emitting device, thereby preventing warping when glass and metal are attached to each other. In order to prevent the temperature rise in the organic light-emitting device, the warp-preventing member 16 is preferably made of a material with high heat conductivity and high heat emissivity, such as AlN ceramic or the like.

Figure 13:
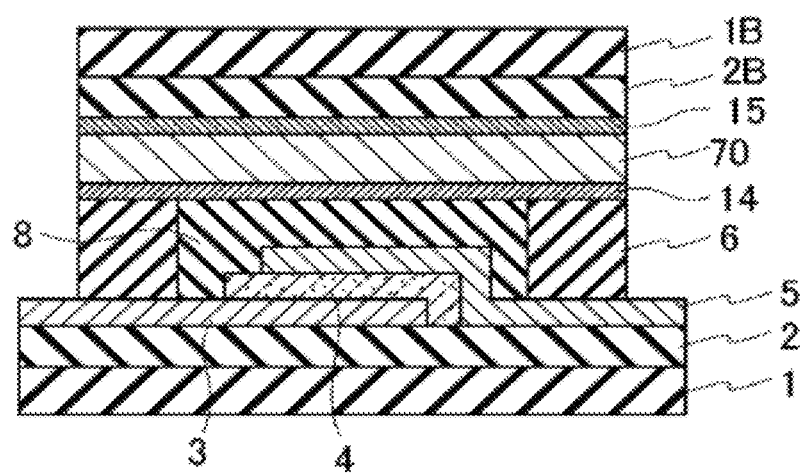
FIG. 13 is a section view showing another configuration example of the organic light-emitting device with the addition of a structure for the prevention of warping otherwise caused by the difference in thermal expansion coefficients of the base plate and the sealing plate.

FIG. 13 shows an organic light-emitting device having a warp-preventing structure, in which a flexible base plate is used. The sealing plate, if metal, can be made flexible. The organic light-emitting device shown in FIG. 13 is configured by adding a warp-preventing structure to the organic light-emitting device shown in FIG. 2. The same portions as those shown in FIG. 2 are designated by like reference numerals and will not be described in detail. The insulating layer 14 and the bonding layer 15 shown in FIG. 13 are the same as those shown in FIG. 12 and, therefore, will not be described.

In FIG. 13, additional first and second flexible base plates 1B and 2B of the same kind as the first and second flexible base plates 1 and 2 in FIG. 2 are laminated on a sealing plate 70. More specifically, the second flexible base plate 2B is bonded to the metallic sealing plate 70 through a bonding layer 15. Then, the first flexible base plate 1B is laminated on the second flexible base plate 2B. It is possible to use, e.g., a plastic sheet, as the first flexible base plate 1B. An extremely thin glass sheet having a thickness of about 50 µm can be used as the second flexible base plate 2B. Even when the base plates have a composite structure, warping caused by the attachment of different materials can be prevented by attaching the same materials as the base plates in a vertically symmetrical relationship. Since the extremely thin glass sheet and the plastic sheet are laminated on the metallic sealing plate 70, significant heat dissipation cannot be expected. However, heat uniformalizing can still be realized by the heat conduction through the metallic sealing plate 70.

Figure 14:
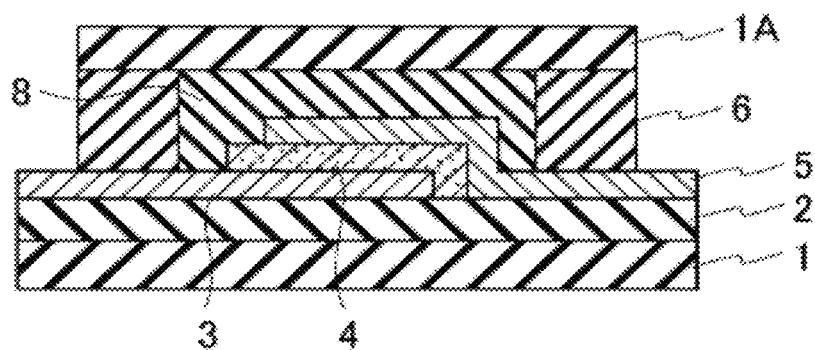
FIG. 14 is a section view showing a further configuration example of the organic light-emitting device with the addition of a structure for the prevention of warping otherwise caused by the difference in thermal expansion coefficients of the base plate and the sealing plate.

One of the important features of the organic light-emitting device of the present disclosure resides in that it is possible to manufacture the device with a reduced thickness. For example, use of a metallic film as the sealing plate makes it possible to manufacture a flexible device having the merit of heat uniformalizing. In order to minimize the thickness, an organic light-emitting device may be configured as shown in FIG. 14. The organic light-emitting device shown in FIG. 14 is manufactured by adding a warp-preventing structure to the organic light-emitting device shown in FIG. 2. The same portions as those shown in FIG. 2 are designated by like reference numerals and will not be described in detail. Using the organic light-emitting device shown in FIG. 2, a sealing plate 1A having the same linear expansion coefficient and thickness as those of the first flexible base plate 1 is formed on the adhesive heat-transferring filling material 6 and the heat-transferring filling material 8. This makes it possible to prevent warping without having to form a composite structure on the sealing plate, as is the case in FIG. 13. Moreover, the organic light-emitting device can be manufactured to have an extremely small thickness.

The organic light-emitting device of the present disclosure can be applied to a wide variety of devices such as an organic EL illumination device, a flexible organic EL device and an organic EL display.

With the present disclosure, the electrically-insulating heat-transferring filling material is formed to cover the organic light-emitting body. The sealing plate is arranged on the heat-transferring filling material. Accordingly, it is possible to broaden the diffusion area of the heat generated in the organic light-emitting body and to efficiently dissipate the heat from the organic light-emitting body. Since the getter material or the cavity (getter chamber) conventionally used can be excluded by employing the heat-transferring filling material formed around the organic light-emitting body, it is possible to simplify the manufacturing process and to reduce the costs.

While certain embodiments have been described, these embodiments have been presented by way of example only, and are not intended to limit the scope of the disclosures. Indeed, the novel organic light-emitting devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An organic light-emitting device, comprising:
a base plate;
an organic light-emitting body disposed on the base plate;
a heat-transferring filling material disposed around the organic light-emitting body so that the organic light-emitting body is completely covered, the heat-transferring filling material having an electrically insulating property, the heat-transferring filling material including
a first heat-transferring filling material disposed around the organic light-emitting body to cover the organic light-emitting body such that the first heat-transferring filling material is in direct contact with the organic light-emitting body so that the organic light-emitting body is completely covered, the first heat-transferring filling material including a physical adsorbent having a getter function, and
a second heat-transferring filling material disposed around the first heat-transferring filling material and made of a material differing from that of the first heat-transferring filling material, the second heat-transferring filling material including an adhesive material;
a sealing plate arranged on the first and second heat-transferring filling materials; and
a heat-dissipating paint disposed on a surface of the sealing plate.

2. The device of claim 1, wherein the sealing plate has a greater thermal conductivity rate than that of glass.

3. The device of claim 2, wherein the sealing plate is made of one member selected from the group consisting of Cu, Al, Ni, Cu—Mo alloy, AlN and $Al_2O_3$.

4. The device of claim 1, wherein the sealing plate is made of a flexible material.

5. The device of claim 4, wherein the sealing plate is a metal film.

6. The device of claim 1, wherein the sealing plate has a linear expansion coefficient falling within ±50% of a linear expansion coefficient of the base plate.

7. The device of claim 1, wherein the first heat-transferring filling material is liquid or solid.

8. The device of claim 7, wherein the first heat-transferring filling material is an inert liquid.

9. The device of claim 7, wherein the first heat-transferring filling material is solid.

10. The device of claim 1, further comprising a cooling member arranged on a portion of the organic light-emitting device.

11. The device of claim 1, further comprising an electrode disposed between the base plate and the first and second heat-transferring filling materials.

12. The device of claim 1, further comprising a chromate film on the surface of the sealing plate.

13. The device of claim 12, wherein the chromate film is between the surface of the sealing plate and the heat-dissipating paint, and the heat-dissipating paint touches the chromate film.

14. The device of claim 11, wherein the electrode includes
a first electrode disposed on the base plate and making contact with the organic light-emitting body, and
a second electrode disposed on the organic light-emitting body and making contact with the base plate.

15. The device of claim 14, wherein the first electrode is entirely separate from the second electrode such that no part of the first electrode touches the second electrode.

16. The device of claim 1, wherein
the organic light-emitting body has a first side and a second side perpendicular to the first side, and
the first heat-transferring filling material is in direct contact with each of the first side and the second side.

17. The device of claim 1, wherein in a sectional view of the device, each side of the organic light-emitting body is completely covered.

18. The device of claim 1, wherein no part of the organic light-emitting body is exposed.

19. The device of claim 1, wherein the first heat-transferring filling material is in direct contact with the second heat-transferring filling material.

* * * * *